United States Patent [19]

Allard

[11] Patent Number: 4,980,659
[45] Date of Patent: Dec. 25, 1990

[54] MICROWAVE DUAL LEVEL TRANSITION

[75] Inventor: William A. Allard, Goleta, Calif.

[73] Assignee: Raytheon Company, Lexington, Mass.

[21] Appl. No.: 397,827

[22] Filed: Aug. 24, 1989

[51] Int. Cl.⁵ .............................................. H01P 5/02
[52] U.S. Cl. ...................................... 333/33; 333/246
[58] Field of Search ..................... 333/33, 238, 246; 361/414

[56] References Cited

U.S. PATENT DOCUMENTS

| | | |
|---|---|---|
| 3,295,074 | 12/1966 | Carr .................................. 333/238 X |
| 3,586,757 | 6/1971 | Haldeman, Jr. ................ 333/238 X |
| 3,656,179 | 4/1972 | DeLoach . |
| 3,786,375 | 1/1974 | Sato et al. . |
| 4,047,132 | 9/1977 | Krajewski . |
| 4,114,120 | 9/1978 | Lupfer . |
| 4,810,981 | 3/1989 | Herstein .......................... 333/238 X |
| 4,901,039 | 2/1990 | Corzine et al. ................. 333/246 X |

OTHER PUBLICATIONS

Patrick, *Flexible Strip Transmission Line*, IBM Tech. Disclosure Bulletin, vol. 2, No. 6, Apr. 1960, pp. 35, 36.

*Primary Examiner*—Paul Gensler
*Attorney, Agent, or Firm*—Edmund J. Walsh; Richard M. Sharkansky

[57] ABSTRACT

A stripline transition between two layers of a multilayer microwave stripline assembly. Two stripline layers are sandwiched between metal plates. The metal plates have formed therein complementary curved transition regions and force a stripline to undergo a gradual transition from a first layer to a second layer of the assembly.

11 Claims, 3 Drawing Sheets

MICROWAVE DUAL LEVEL TRANSITION

BACKGROUND OF THE INVENTION

This invention relates generally to microwave circuits and more particularly to multilayer stripline assemblies.

Many systems employ microwave circuitry. Often, these systems must fit into small volumes, and it is desirable to reduce the size of the microwave circuitry. The space problem might, for example, be particularly acute in a power divider where signals are routed to several points. One way to reduce the volume occupied by microwave circuitry is to form several levels.

Several layers of striplines are formed in a dielectric medium which can be stacked to form the various levels. These striplines carry the microwave signals or are part of stripline circuit elements. In this way, the packing density of the circuitry is increased much the same way a multilayer printed circuit board increases the packing density of low frequency circuitry.

One problem associated with having multilevel microwave structures is that of routing signals between the various levels. For example, it is often desirable to have all inputs and outputs to the assembly on the same level to facilitate connections to the assembly. Signals then must be routed from the level with inputs and outputs to all other levels. In other instances, it may be necessary to have one signal pass from one layer to another to facilitate the desired interconnection of circuit elements.

Because microwave signals propagate in transmission lines, wires cannot simply be used to interconnect the various levels of a microwave assembly. One approach to providing interconnections between various levels in a microwave assembly is the use of coaxial feed throughs. A piece of coax, which supports propagation of microwave signals, passes through the structure perpendicular to the stripline. The coaxial feed-through is coupled at each end to the striplines on different levels.

The coaxial feed through is relatively compact. However, it suffers from what can sometimes be a significant drawback. The modes of propagation in the stripline and the coaxial feed through are different. Thus, there are two mode transitions in the feed through. Mode transitions can cause signal reflections which impair the operation of the circuit. Also, the use of coax to join two striplines may result in impedance mismatches which reduce the level of the desired signal.

SUMMARY OF THE INVENTION

With the foregoing background of the invention in mind, it is an object of this invention to provide a means for interconnecting transmission lines at different levels of a multilevel microwave assembly.

It is also an object to provide a means for making all input and output connections to a multilevel microwave assembly at the same level.

It is further an object of this invention to provide an impedance matched signal transition with no mode changes between levels of a multilevel microwave assembly.

The foregoing and other objects of this invention are achieved by forming two levels of stripline circuitry between a top cover plate and a bottom cover plate. At a transition, the cover plates have complementary curved surfaces. Stripline is disposed along the curved surface. When the cover plates are pressed together, the stripline conforms to the curved surfaces and has its ends at different levels of the assembly.

BRIEF DESCRIPTION OF THE DRAWINGS

The invention may be better understood by the following more detailed description and accompanying drawings in which.

DESCRIPTION OF THE PREFERRED EMBODIMENT

Figure 1:
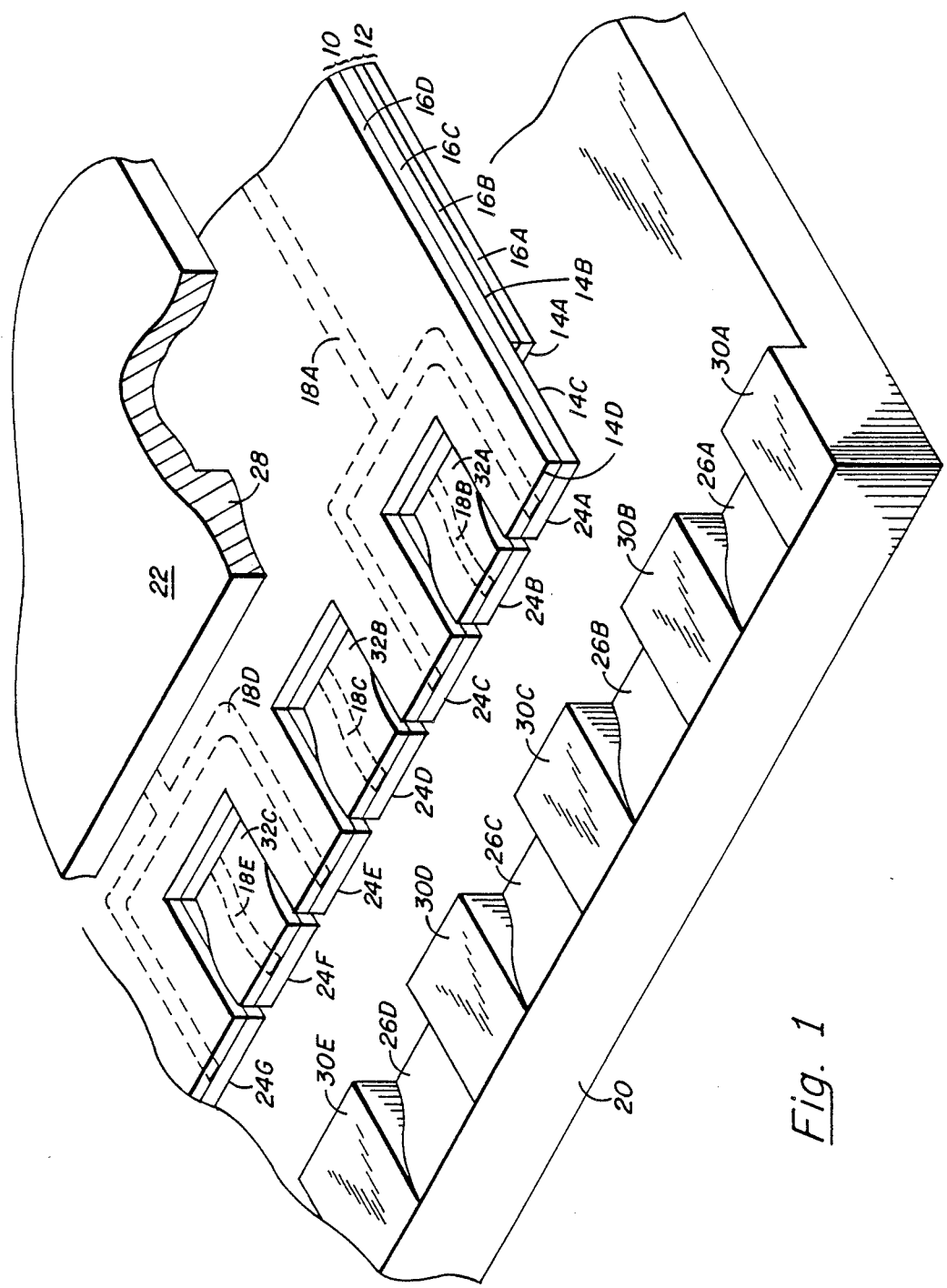
FIG. 1 depicts a transition according to the invention for a two level stripline assembly configured to allow all input and output connections to be made on the top level.

Turning now to FIG. 1, a dual level microwave stripline assembly is shown in exploded view. The assembly has an upper layer 10 and a lower layer 12 sandwiched between an upper plate 22 and a lower plate 20.

Upper layer 10 and lower layer 12 each contain two dielectric sheets. Lower layer 12 comprises dielectric sheets 16A and 16B. Upper layer 10 comprises dielectric sheets 16C and 16D. Suitable dielectric sheets are available from Rogers Company of Chandler, Ariz., under the brand name Duroid. These sheets have a thickness of approximately 0.03 inches and a relative dielectric constant of 2.2. However, other soft dielectric sheets, such as those made from Teflon-fiberglass, could be used. The two dielectric sheets of each layer could be glued together. Alternatively, they could be held in place by upper plate 22 and lower plate 20.

Each layer 10 and 12 also contains two ground planes. Lower layer 12 comprises ground planes 14A and 14B. Upper layer 10 comprises ground planes 14C and 14D. The ground plane layers 14A . . . 14D are made by attaching metal film to the dielectric sheets. The aforementioned dielectric sheets can be purchased with a film laminated on one or both sides.

Striplines are formed in each layer by a center conductor. The center conductors are formed from metal film attached to the dielectric sheets making up that layer. For example, center conductors 18A and 18D in upper layer 10 are disposed between dielectric sheets 16C and 16D. Striplines are formed in lower layer 12 in a similar fashion by attaching a metal film between dielectric sheets 16A and 16B. In practice, the center conductor is often formed by etching away portions of a metal film attached to one surface of a dielectric sheet.

As shown in FIG. 1, striplines in lower layer 12 and upper layer 10 are routed to one edge of the assembly to form stripline outputs 24A . . . 24G. For example, each of the stripline outputs 24A . . . 24G could be connected to one element in an antenna array. In an alternative embodiment, the stripline outputs could be inputs used to apply signals to the stripline assembly or a combination of inputs and outputs. The stripline outputs 24B, 24D and 24F couple signals from lower layer 12. The stripline outputs 24A, 24C, 24E and 24G couple signals from upper layer 10. However, all stripline outputs 24A . . . 24G are at the same level.

The colinear arrangement of stripline outputs 24A . . . 24G is achieved by the shape of lower plate 20 and upper plate 22. The stripline outputs 24A, 24C, 24E and 24G connect to striplines in upper layer 10. They are thus at the desired level and rest on fingers 30A, 30B, 30C, 30D and 30E in lower plate 20. On the other hand, stripline outputs 24B, 24D and 24F connect to striplines in lower layer 12. They must be brought up to be colinear with stripline outputs 24A, 24C, 24E and 24G. They thus rest on lower transition regions 26A, 26B, and 26C.

Lower transition regions 26A, 26B, 26C, 26D are curved, in a manner described in greater detail in connection with FIG. 2B. Tabs 32A, 32B and 32C of lower layer 12 rest on lower transition regions 26A, 26B and 26C, respectively, and follow their contours. Stripline outputs 24B, 24D and 24F are thus brought colinear with stripline outputs 24A, 24C, 24E and 24G. They thus undergo a transition from lower layer 12 to upper layer 10.

Tabs 32A, 32B and 32C are forced to conform to the contours of lower transition regions 26A, 26B and 26C by complementary contours formed in upper plate 22, only one of which is shown. FIG. 1 shows that upper transition region 28 has contours complementary to those in lower transition region 26A. In constructing the microwave assembly of FIG. 1, upper plate 22 and lower plate 20 are held tightly together by some known means such as screws or clamps. Thus, when tab 32A is placed between upper plate 22 and lower plate 20, it will be forced to conform with lower transition region 26A.

Figure 2A:
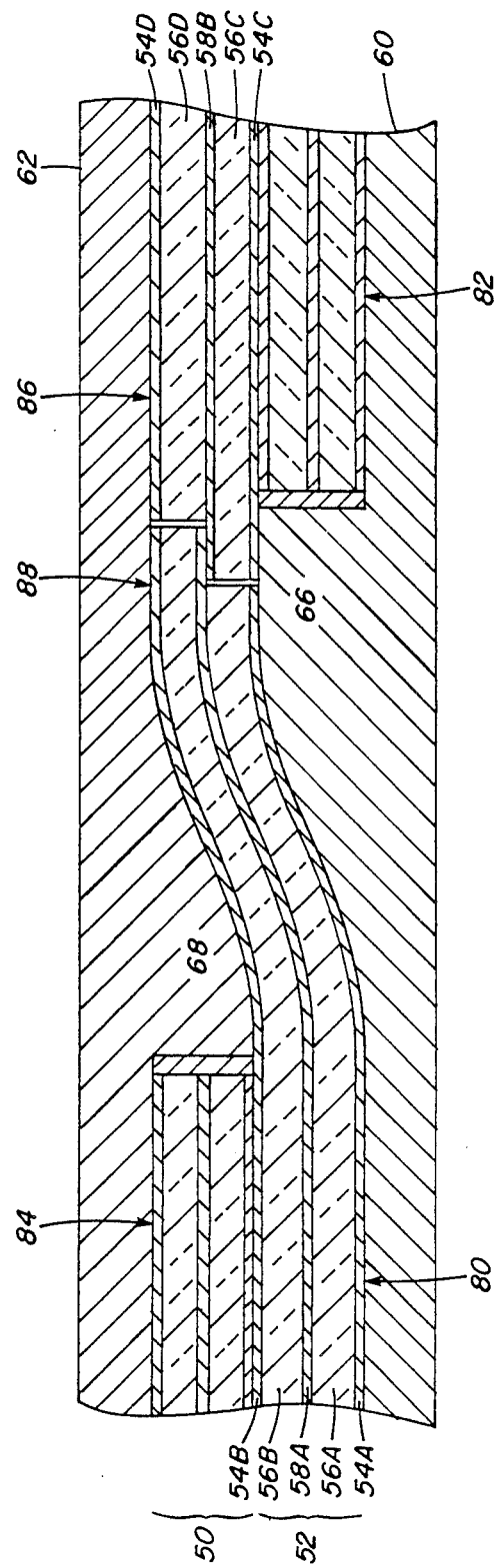
FIG. 2A is a cross-sectional view of a transition according to the invention to allow signals on one level of a two-level assembly to pass through to the other level.

Turning now to FIG. 2A, a portion of a microwave assembly containing a transition according to the invention is shown. The assembly has a lower layer 52 of stripline circuits and an upper layer 50 of stripline circuits. Here, lower layer 52 is shown to contain striplines 80 and 82 and upper layer 50 is shown to contain striplines 84 and 86. Stripline 80 transitions from lower layer 52 to upper layer 50, thereby connecting striplines 80 and 86.

Each of the striplines 80, 82, 84, 86 is formed, as described previously, from two dielectric sheets. Taking stripline 80 as representative, dielectric sheets 56A and 56B have formed on them metal films to form ground planes 54A and 54B. A metal film is attached to the lower surface of dielectric sheet 56B to form center conductor 58A of stripline 80.

Lower plate 60 has formed in it a lower transition region 66 having the same shape as lower transition region 26A (FIG. 1). Upper plate 62 has formed in it an upper transition region 68 having the same shape as upper transition region 28. Thus, when lower plate 60 and upper plate 62 are pressed together, stripline 80 conforms to the contour and transitions from lower level 52 to upper level 50.

Stripline 80 is electrically connected to stripline 86. Signals propagating through stripline 80 continue to propagate through stripline 86. There is no mode change or any significant reflection of microwave signals at the interface between striplines 80 and 86.

The electrical connection between striplines 80 and 86 is achieved by means of a "lap joint" 88. Dielectric sheet 56B extends beyond dielectric sheet 56A. This allows dielectric sheet 56B to overlap dielectric sheet 56C, which is part of stripline 86. This overlap ensures the center conductors of striplines 80 and 86 are in electrical contact. Center conductor 58A of stripline 80 is on the bottom of dielectric slab 56B. Center conductor 58B is on the top of dielectric slab 56C. Thus, where dielectric slabs 56B and 56C overlap at lap joint 88, the center conductors 58A and 58B also overlap, ensuring good electrical contact.

It might be noted that the ground planes of striplines 80 and 86 do not overlap. However, there is no problem of good electrical connection of the ground planes. All the ground planes are in contact with either lower plate 60 or upper plate 62, which are made of conducting materials and are at ground potential.

Figure 2B:
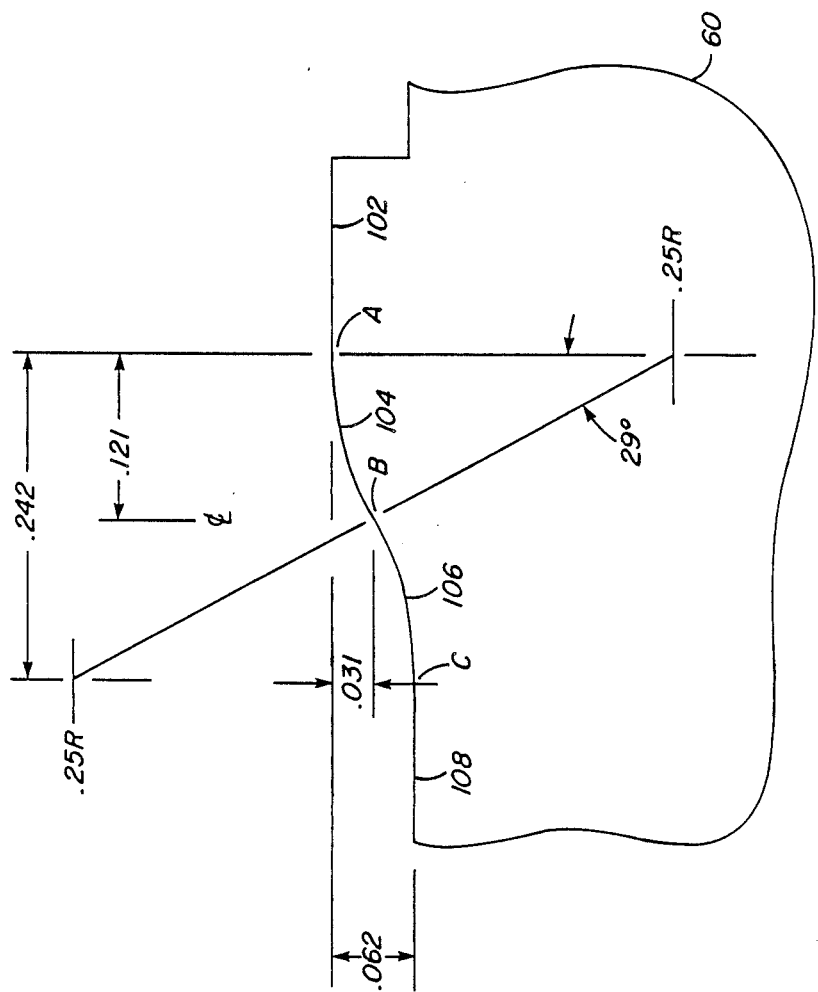
FIG. 2B is a more detailed cross-section of the transition of FIG. 2A.

Turning now to FIG. 2B, additional details of lower transition region 66 can be seen. Lower plate 60 contains a flat portion 102 to support upper layer 50 (FIG. 2A) and a flat portion 108 to support lower layer 52 (FIG. 2A). Flat portions 102 and 108 differ in height by 0.062 inches, which is the thickness of one stripline. This thickness, however, can vary depending on the operating frequency of the assembly. If different sized dielectric is used, the dimensions of the transition region would have to be adjusted.

The curved portions 104 and 106 of the transition region have a total length of 0.242 inches. The point of maximum curvature occurs at point 8. At point B, the radius of curvature of the surface of lower plate 60 is 0.25 inches. This dimension is important because the dielectric sheets must conform to the curvature. For smaller radii of curvature, the metal foil on the dielectric sheets used to make the center conductors and ground planes tends to wrinkle and crack. Wrinkled or cracked metal sheets yield poor performance on the striplines.

Having described one embodiment of the invention, it will become apparent to one of skill in the art that various alternative embodiments could be constructed. For example, the embodiments shown have two layers of stripline. Assemblies with more layers could be constructed by adding more layers and an additional plate for every two layers. It is felt, therefore, that the invention should be limited only by the spirit and scope of the appended claims.

What is claimed is:

1. In a microwave circuit assembly of the type having stripline circuitry disposed on at least a first level and a second level, an improved transition between the two levels comprising:
   (a) a lower plate, said plate having formed therein a first curved region extending from the first level to the second level and a flat region;
   (b) an upper plate, said plate having formed therein a second curved region complementary to the first curved region and a flat region;
   (c) a first stripline disposed between the lower plate and the upper plate, said first stripline conforming to the first curved region, the second curved region, and to the flat region of the lower plate; and
   (d) a second stripline disposed between the lower plate and the upper plate, said second stripline conforming to the flat region of the upper plate.

2. The microwave circuit assembly of claim 1 wherein the stripline circuitry comprises the first stripline on the first level electrically connected to the second stripline on the second level.

3. The microwave circuit assembly of claim 2 wherein the first stripline and the second stripline comprise an upper dielectric sheet and a lower dielectric sheet with a center conductor disposed between them.

4. The microwave circuit assembly of claim 1 wherein a first portion of the stripline comprises a stripline at a first level of the assembly and a second portion of the stripline comprises a stripline output at a second level.

5. The microwave circuit assembly of claim 4 additionally comprising a plurality of stripline outputs at the second level.

6. The microwave circuit assembly of claim 1 wherein the stripline has a thickness of 0.062 inches and the first curved region has a minimum radius of curvature of 0.25 inches.

7. The microwave circuit assembly of claim 1 wherein the tangent of the first curved region makes an angle less than 90° in relation to the flat region of the lower plate.

8. In a microwave circuit assembly of the type having stripline circuitry disposed on at least a first level and a second level, an improved transition between the two levels comprising:

(a) a lower plate, said plate having formed therein a first curved region extending from the first level to the second level;

(b) an upper plate, said plate having formed therein a second curved region complementary to the first curved region;

(c) a stripline disposed between the lower plate and the upper plate, said stripline conforming to the first curved region and the second curved region;

(d) wherein the stripline circuitry comprises a first stripline on the first level electrically connected to a second stripline on the second level;

(e) wherein the first stripline and the second stripline comprise an upper dielectric sheet and a lower dielectric sheet with a center conductor disposed between them; and (f) wherein the upper dielectric sheet of the first stripline overlaps the lower dielectric sheet of the second stripline.

9. The microwave circuit assembly of claim 8 wherein the center conductor of the first stripline is affixed to the upper dielectric sheet and the center conductor of the second stripline is affixed to the lower dielectric sheet.

10. The microwave circuit assembly of claim 9 wherein the upper and lower plate are formed from conductive material.

11. The microwave circuit assembly of claim 10 wherein the first stripline and the second stripline comprise a layer of metal film to form a ground plane.

* * * * *